(12) United States Patent
Chun et al.

(10) Patent No.: US 8,222,120 B2
(45) Date of Patent: Jul. 17, 2012

(54) METHOD OF DICING WAFER USING PLASMA

(75) Inventors: Jung Hwan Chun, Chungcheongnam-do (KR); Gyu Han Kim, Gyeonggi-do (KR)

(73) Assignee: STS Semiconductor & Telecommunications Co., Ltd. (KR)

( * ) Notice: Subject to any disclaimer, the term of this patent is extended or adjusted under 35 U.S.C. 154(b) by 425 days.

(21) Appl. No.: 12/549,825

(22) Filed: Aug. 28, 2009

(65) Prior Publication Data
US 2010/0311223 A1    Dec. 9, 2010

(30) Foreign Application Priority Data
Jun. 5, 2009 (KR) .................. 10-2009-0049910

(51) Int. Cl.
*H01L 21/336* (2006.01)
(52) U.S. Cl. ................. 438/462; 257/E21.214
(58) Field of Classification Search .......... 438/462; 257/E21.214
See application file for complete search history.

(56) References Cited

U.S. PATENT DOCUMENTS 6,498,074 B2 * 12/2002 Siniaguine et al. .......... 438/460
6,642,127 B2 * 11/2003 Kumar et al. ............... 438/460

FOREIGN PATENT DOCUMENTS

| JP | 2009033154 A | | 2/2009 |
|---|---|---|---|
| KR | 100828025 B1 | | 5/2008 |
| WO | WO 03028949 | * | 4/2003 |
| WO | WO 03/036712 | * | 5/2003 |
| WO | WO 2008/081968 | * | 7/2008 |

* cited by examiner

*Primary Examiner* — David S Blum
(74) *Attorney, Agent, or Firm* — St. Onge Steward Johnston & Reens LLC (57) ABSTRACT

Provided is a method of dicing a wafer that is thin and includes a low-K material using plasma without causing chipping and cracking during sawing without using an etch mask and without performing a separate wafer coating process. The method includes recognizing scribe lines of a front side of the wafer by using an image recognizing unit to obtain recognition information, performing two etching processes, wherein at least one includes plasma etching, on a backside of the wafer by using the recognition information to separate the wafer into a plurality of semiconductor chips, and adhering the plurality of semiconductor chips to an extended tape or a die attach film.

15 Claims, 7 Drawing Sheets

METHOD OF DICING WAFER USING PLASMA

CROSS-REFERENCE TO RELATED APPLICATIONS

This application claims the benefit of Korean Patent Application No. 10-2009-0049910, filed on Jun. 5, 2009, in the Korean Intellectual Property Office, the disclosure of which is incorporated herein in its entirety by reference.

FIELD OF THE INVENTION

The present invention relates to a process of manufacturing a semiconductor package, and more particularly, to a method of dicing a wafer including a low-K material using plasma.

BACKGROUND OF THE INVENTION

In a semiconductor package assembly process, dicing refers to a process of cutting a wafer into a plurality of semiconductor chips using mechanical sawing with a blade or laser cutting. In other words, dicing refers to a process of separating a wafer into individual semiconductor chips so that the individual semiconductor chips can be mounted on a basic frame and encapsulated into a lead frame or a printed circuit package.

As semiconductor devices are developed to have higher capacity, higher speed, and smaller scale, low-K materials are increasingly used as an insulating material between metals. In general, a low-K material refers to a material having a dielectric constant that is less than the dielectric constant of silicon dioxide.

A method of dicing a wafer including a low-K material using mechanical sawing with a blade has a disadvantage in that during dicing, chipping, which is an event where semiconductor chips partially break, and cracking, which is an event where semiconductor chips are cracked, may occur. Accordingly, there is a demand for a method of dicing a wafer which can prevent chipping or cracking in a semiconductor package assembly process.

In order to fulfill the demand, a method of dicing a wafer using laser cutting or plasma etching, instead of mechanical sawing with a blade, has been proposed because even if the rotational speed of the blade is controlled when cutting a wafer, chipping and cracking may be minimized but high quality cut semiconductor chips may not be obtained. Also, if the rotational speed of the blade is controlled, the number of semiconductor chips obtained per unit time may be reduced, thereby lowering productivity.

However, a method of dicing a wafer using laser cutting has a disadvantage in that, when the wafer is grooved along scribe lines or is completely cut along the scribe lines, active surfaces of semiconductor chips should be coated with an expensive coating material in order to prevent silicon particles from being fused onto the active surfaces of the semiconductor chips. Also, the method of dicing the wafer using the laser cutting has another disadvantage in that, since a laser used to groove the wafer and a laser used to completely cut the wafer are different from each other, when the wafer is completely cut along the scribe lines, a die attach film (DAF) which is located in the backside of the wafer is not easily cut.

When a wafer is cut along scribe lines, a method of dicing a wafer using plasma etching requires an etch mask in order to prevent surfaces of semiconductor chips from being etched. The method of dicing the wafer using the plasma etching has a disadvantage in that the etch mask is formed using photolithography in a general wafer manufacturing process and thus makes semiconductor packaging complex and increases manufacturing costs.

SUMMARY OF THE INVENTION

The present invention provides a method of dicing a wafer, which is thin and includes a low-K material, using plasma etching without using an etch mask and without performing a separate wafer coating process.

According to an aspect of the present invention, there is provided a method of dicing a wafer using plasma, the method including: recognizing scribe lines of an active surface of the wafer by using an image recognizing unit to obtain recognition information; converting the recognition information into position information about a backside of the wafer to obtain wafer backside dicing information; preparing a cassette ring to which the wafer is attached, wherein a lamination tape is attached to the active surface of the wafer; performing first etching on the backside of the wafer to form grooves having a depth that is half of the thickness of the wafer by using the wafer backside dicing information; and isotropically performing second etching using plasma on the backside of the wafer having the grooves formed therein to separate the wafer into a plurality of semiconductor chips.

The performing of the first etching may include etching the grooves to a depth of 50 to 90% of the thickness of the wafer. The performing of the first etching may include performing the first etching using mechanical sawing with a blade formed of a diamond material.

The performing of the first etching may include performing the first etching using laser cutting.

The wafer may be one selected from the group consisting of a silicon wafer, a compound semiconductor wafer, and a glass wafer.

According to another aspect of the present invention, there is provided a method of dicing a wafer using plasma, the method including: mounting the wafer in a first cassette ring to which a lamination tape is attached; separating the wafer into a plurality of semiconductor chips using two etching processes, wherein at least one of the two etching processes comprises plasma etching; preparing a second cassette ring to which a die attach film, to which an extended tape is attached, is attached, wherein the die attach film is cut into a plurality of die attach film pieces; aligning the first cassette ring with the second cassette ring; and adhering bottom surfaces of the plurality of semiconductor chips of the first cassette ring to the plurality of die attach film pieces of the die attach film of the second cassette ring.

The mounting of the wafer in the first cassette ring may include disposing the wafer in the first cassette ring in such a way that an active surface of the wafer is adhered to the lamination tape.

The separating of the wafer into the plurality of semiconductor chips using the two etching processes may include: recognizing scribe lines of an active surface of the wafer by using an image recognizing unit to obtain recognition information; converting the recognition information into position information corresponding to a backside of the wafer to obtain wafer backside dicing information; performing first etching on the backside of the wafer by using the wafer backside dicing information to form grooves having a depth that is half of the thickness of the wafer corresponding to the scribe lines; and performing second etching using plasma on the backside of the wafer having the grooves formed therein) to separate the wafer into a plurality of semiconductor chips.

The recognizing of the scribe lines of the active surface of the wafer by using the image recognizing unit may include recognizing the scribe lines through the lamination tape, wherein the lamination tape is transparent and is attached to the first cassette ring. The recognizing of the scribe lines of the active surface of the wafer may include recognizing the scribe lines on a front side of the wafer before the wafer is mounted in the first cassette ring.

The performing of the first etching may include performing the first etching using any one selected from the group consisting of mechanical sawing with a blade and laser cutting.

The performing of the second etching may include isotropically etching all of a backside of the wafer to separate the wafer into a plurality of semiconductor chips.

Each of the plurality of die attach film pieces of the die attach film attached to the second cassette ring may have a size that is less than the size of each of the plurality of semiconductor chips. After adhering the bottom surfaces of the plurality of semiconductor chips of the first cassette ring to the plurality of die attach film pieces of the die attach film of the second cassette ring, the method may further include removing the lamination tape from the first cassette ring.

According to another aspect of the present invention, there is provided a method of dicing a wafer using plasma, the method comprising: mounting the wafer in a first cassette ring to which a lamination tape is attached; sawing the wafer into a plurality of semiconductor chips using two etching processes, wherein at least one of the two etching processes comprises plasma etching; preparing a second cassette ring to which an extended tape is attached; and adhering the plurality of semiconductor chips of the first cassette ring to the extended tape of the second cassette ring.

The sawing of the wafer into the plurality of semiconductor chips may include: recognizing scribe lines of an active surface of the wafer by using an image recognizing unit to obtain recognition information; converting the recognition information into position information corresponding to a backside of the wafer to obtain wafer backside dicing information; performing first etching on the backside of the wafer by using the wafer backside dicing information along the scribe lines to form grooves having a depth that is half of the thickness of the wafer; and performing second etching using plasma on the backside of the wafer having the grooves formed therein to separate the wafer into a plurality of semiconductor chips.

The performing of the first etching may include performing the first etching using any one selected from the group consisting of mechanical sawing with a blade and laser cutting. The performing of the second etching using the plasma may include isotropically etching all of a backside of the wafer to separate the wafer into a plurality of semiconductor chips.

After adhering the plurality of semiconductor chips of the first cassette ring to the extended tape of the second cassette ring, the method may further include removing the lamination tape from the first cassette ring.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. In this regard, the present invention may be embodied in many different forms and should not be construed as being limited to the embodiments set forth herein. Accordingly, embodiments are merely described below, by referring to the figures, in order to explain aspects of the present invention to one of ordinary skill in the art.

Figure 1:
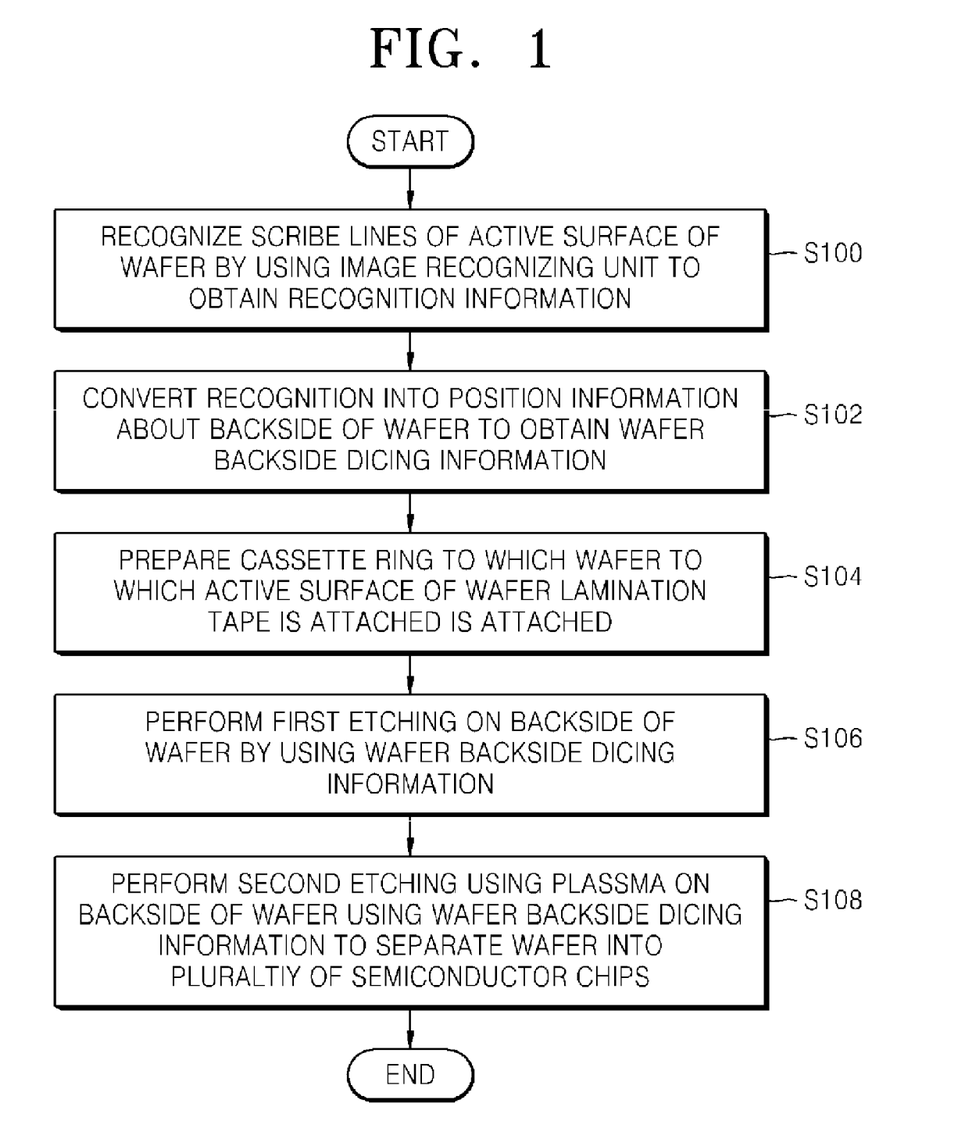
FIG. 1 is a flowchart illustrating a method of dicing a wafer using plasma, according to an embodiment of the present invention.

FIG. 1 is a flowchart illustrating a method of dicing a wafer using plasma, according to an embodiment of the present invention. FIGS. 2 through 6 are views for explaining the method of FIG. 1.

Referring to FIG. 1, in operation S100, scribe lines of an active surface of the wafer are recognized by an image recognizing unit to obtain recognition information. In operation S102, the recognition information is numerically represented and converted by the image recognizing unit to obtain wafer backside dicing information. The image recognizing unit, e.g., a vision system, is widely used for wire bonding and dicing in the field of semiconductor packaging, and the conversion of the recognition information into position information corresponding to the backside of the wafer to obtain the wafer backside dicing information is commonly used. Accordingly, a detailed explanation of the image recognizing unit and the conversion of the recognition information will not be given.

In operation S104, a cassette ring to which the wafer, to which the active surface of the wafer a lamination tape is attached, is attached is prepared. Here, the cassette ring is a tool used for dicing or die attaching. In operation S106, the cassette ring to which the wafer is attached is flipped over and first etching is performed on the backside of the wafer by using the wafer backside dicing information obtained by the image recognizing unit to form grooves in the backside of the wafer along the scribe lines. In operation S108, second etching is isotropically performed using plasma on the backside of the wafer according to the wafer backside dicing information to separate the wafer into a plurality of semiconductor chips.

The method of FIG. 1 will be explained again in detail with reference to FIGS. 2 through 6.

Figure 2:
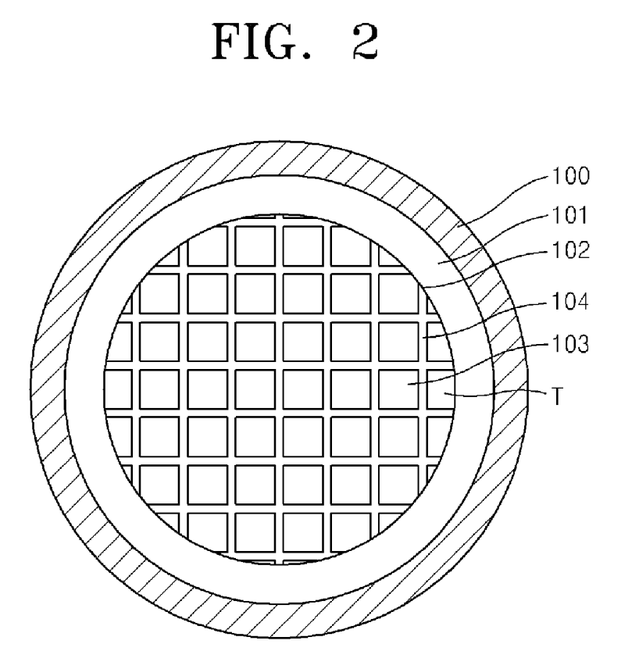
FIG. 2 is a top plan view of a wafer for explaining the method of FIG. 1.
Figure 3:
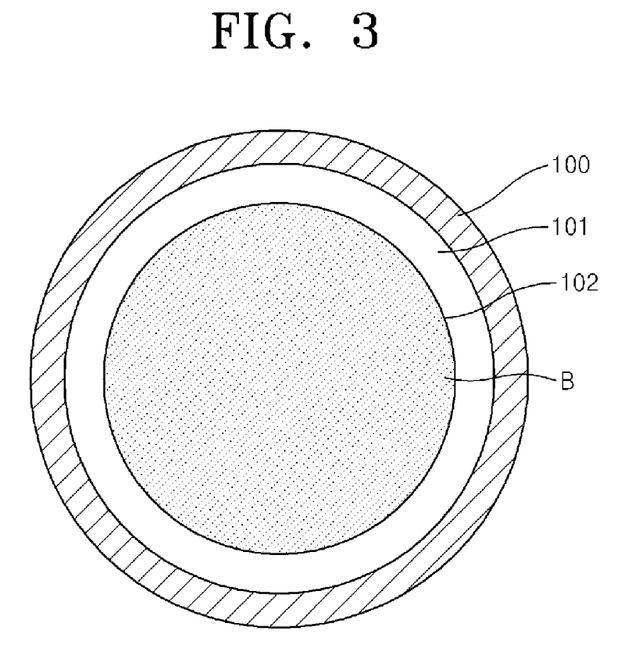
FIGS. 3 and 4 are bottom plan views of the wafer for explaining the method of FIG. 1.

Referring to FIG. 2, a lamination tape 101 is attached to an active surface T of a wafer 102, and the wafer 102 is disposed in a cassette ring 100. The wafer 102 is divided into a plurality of semiconductor chips 103 along scribe lines 104 on the active surface T. The lamination tape 101 may be an adhesive tape formed of a transparent material. The lamination tape 101 holds the wafer 102 and prevents the active surface T of the wafer 102 from being contaminated with particles that are generated during a subsequent sawing process.

Next, the scribe lines 104 of the active surface T of the wafer 102 are recognized by using an image recognizing unit on the lamination tape 101 that is transparent, and position information about the scribe lines 104 is numerically represented and converted into wafer backside dicing information.

If the lamination tape 101 is not transparent, the wafer backside dicing information may be obtained by the image recognizing unit before the wafer 102 is attached to the lamination tape 101.

Referring to FIG. 2, the cassette ring 101 is flipped over to expose a backside B of the wafer 102. Although the wafer 102 is a silicon wafer in FIGS. 1 through 6, the wafer 102 may be a compound semiconductor wafer or a glass wafer.

Figure 4:
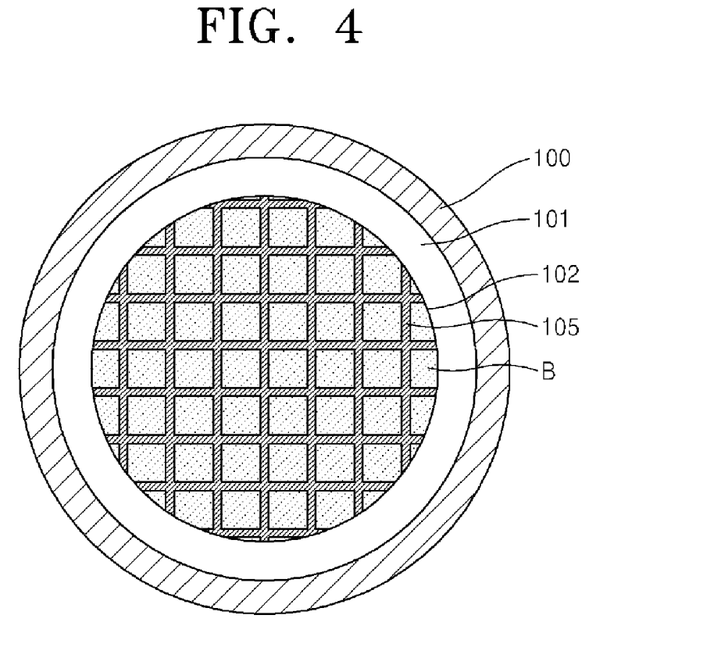
Figure 5:
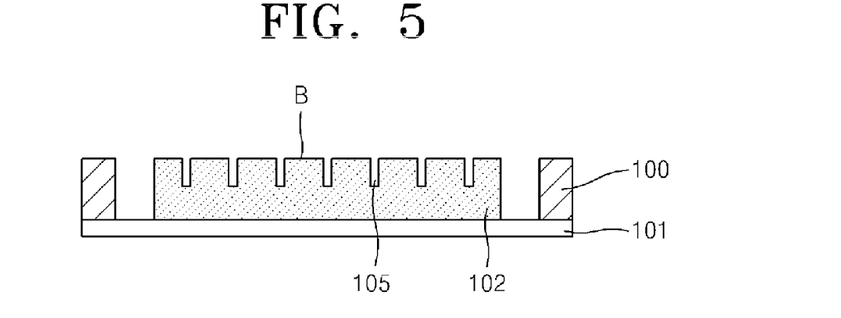
FIG. 5 is a cross-sectional view of the wafer of FIG. 4.

Referring to FIGS. 4 and 5, first etching is performed on the backside B of the wafer 102 by using the wafer backside dicing information obtained by the image recognizing unit to form grooves 105. The grooves 105 are formed in the backside B of the wafer 102 to correspond to the scribe lines 104 formed on the active surface T of the wafer 102. The depth of the grooves 105 formed by the first etching may range from 50 to 90% of the thickness of the wafer 102. The first etching may be performed using mechanical sawing with a blade formed of a diamond material, or using laser cutting. If the grooves 105 are formed using laser cutting, since the first etching is performed on the backside B of the wafer 102, a separate wafer coating process is not necessary.

Figure 6:
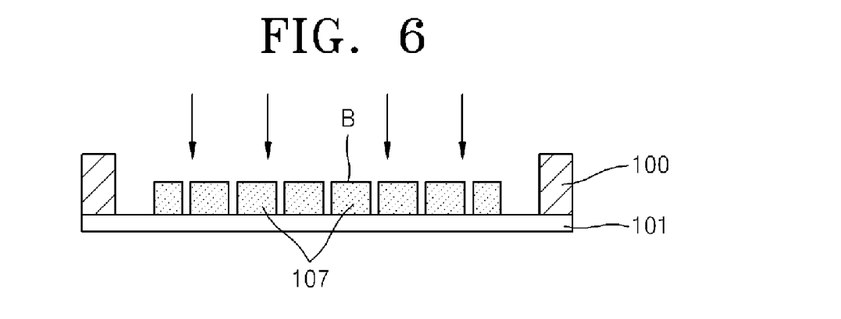
FIG. 6 is a cross-sectional view illustrating a case where second plasma etching is performed on the wafer of FIG. 4 to separate the wafer into a plurality of semiconductor chips.

Referring to FIG. 6, second etching is isotropically performed on the backside B of the wafer 102 using plasma according to the wafer backside dicing information to separate the wafer 102 into a plurality of semiconductor chips 107. During the second etching using the plasma, the entire backside B of the wafer 102 including the grooves 105 is etched to a uniform thickness, and an etch mask that is used for general dicing using plasma is not necessary. It is preferable that the lamination tape 101 is not cut off during the second etching using the plasma.

A case where a die attach film is attached to a plurality of semiconductor chips will now be explained.

Figure 7:
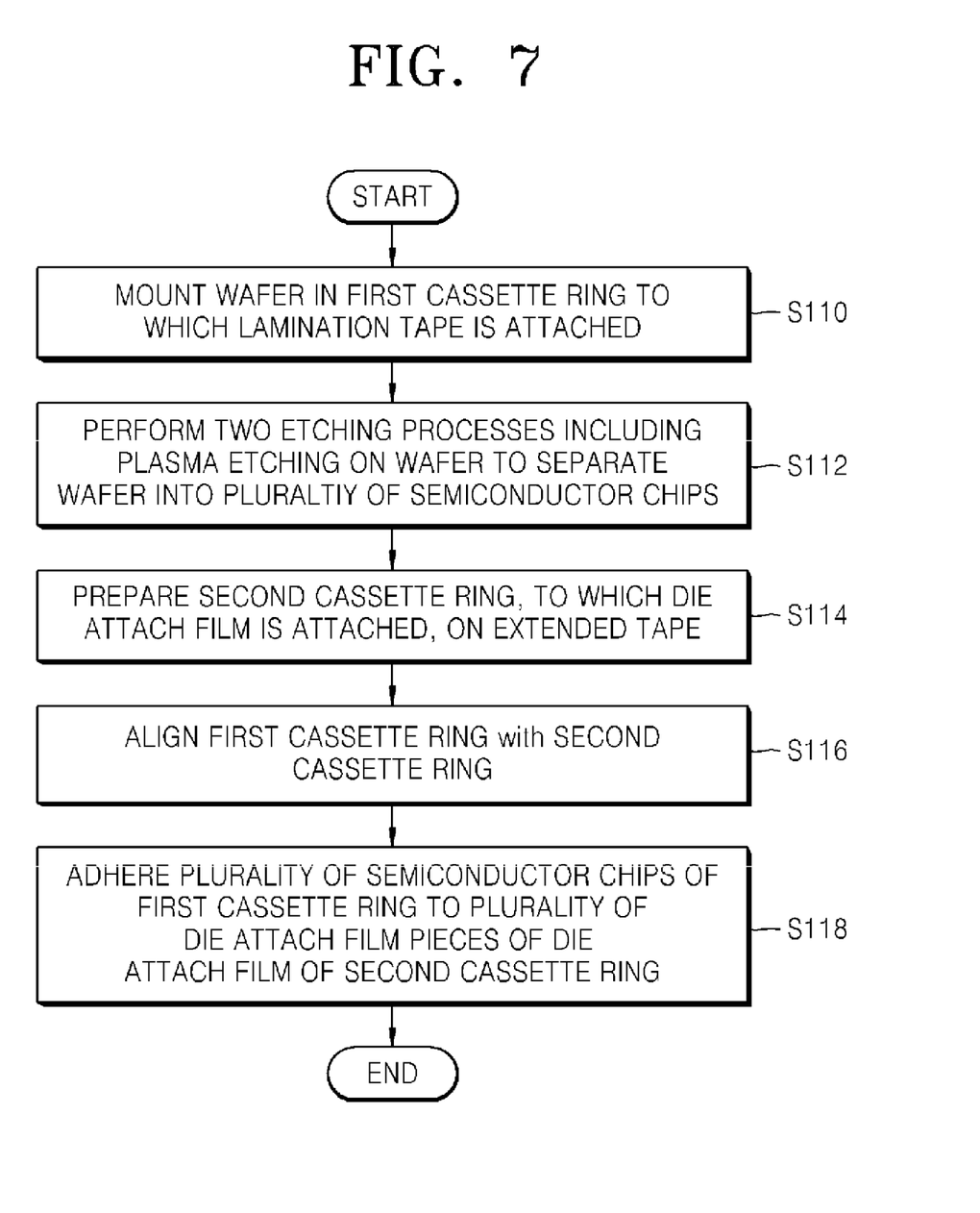
FIG. 7 is a flowchart illustrating a method of dicing a wafer using plasma, according to another embodiment of the present invention.

FIG. 7 is a flowchart illustrating a method of dicing a wafer using plasma, according to another embodiment of the present invention.

Referring to FIG. 7, in operation S110, a wafer is disposed in a first cassette ring to which a lamination tape is attached as illustrated in FIG. 2. Wafer backside dicing information is obtained by using an image recognizing unit as illustrated in FIG. 2. In operation S112, two etching processes, wherein at least one includes plasma etching, are performed on the wafer to separate the wafer into a plurality of semiconductor chips.

In operation S114, a second cassette ring to which a die attach film is attached is prepared on an extended tape. The die attach film is cut into a plurality of die attach film pieces. In operation S116, the first cassette ring and the second cassette ring are aligned to each other. In operation S118, the plurality of semiconductor chips of the first cassette ring and the plurality of die attach film pieces of the die attach film of the second cassette ring are adhered to each other. Optionally, the lamination tape attached to the first cassette ring may be removed.

The method of FIG. 7 will be explained again in detail with reference to FIGS. 8 through 10.

Figure 8:
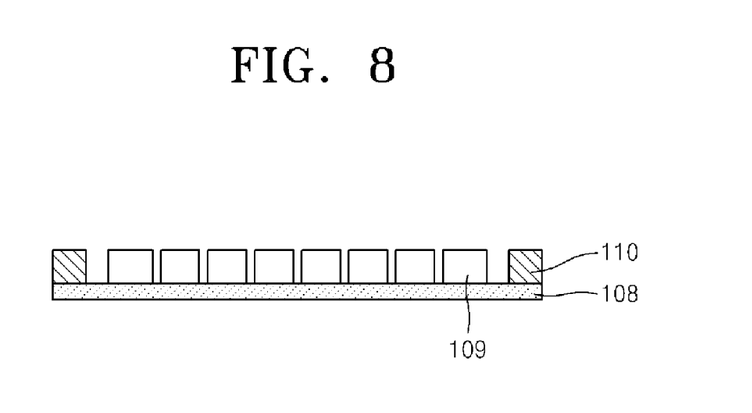
FIG. 8 is a cross-sectional view illustrating a case where an extended tape and a die attach film, which is cut into a plurality of die attach film pieces, are attached to a second cassette ring.

Referring to FIG. 8, an extended tape 108 is attached to cover one side of a second cassette ring 110, and a die attach film 109 cut into a plurality of die attach film pieces is attached to the extended tape 108. The die attach film 109 may be cut by using wafer backside dicing information obtained by the image recognizing unit. The size of each of the plurality of die attach film pieces of the die attach film 109 may be less than the size of each of the plurality of semiconductor chips 107 (see FIG. 6) of the first cassette ring 100 (see FIG. 2).

The die attach film 109 may be cut using one etching process, or using two etching processes as described in the method of FIG. 1. If the die attach film 109 is cut using mechanical sawing with a blade, the size of each of the plurality of die attach film pieces of the die attach film 109 may be less than the size of each of the plurality of semiconductor chips 107 by adjusting the width of the blade. If the die attach film 109 is cut using laser cutting or plasma etching, the size of each of the plurality of die attach film pieces of the die attach film 109 may be less than the size of each of the plurality of semiconductor chips 107 by adjusting etching conditions. The reason why the size of each of the plurality of die attach film pieces of the die attach film 109 is to be less than the size of each of the plurality of semiconductor chips 107 is to reduce defects that may occur due to burrs of the die attach film 109 during a subsequent process.

Figure 9:
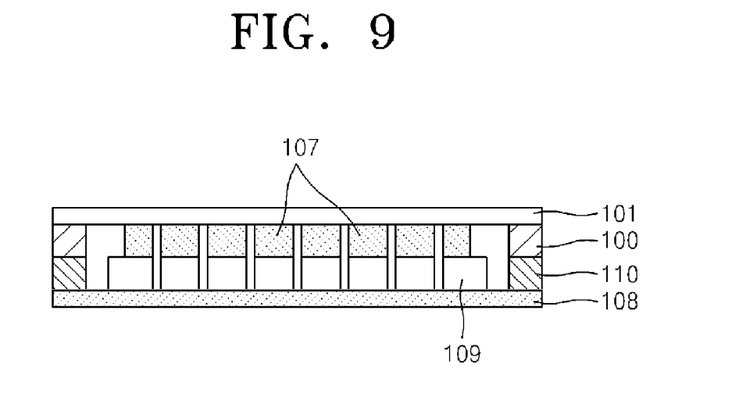
FIG. 9 is a cross-sectional view illustrating a case where a first cassette ring is aligned with the second cassette ring.

Referring to FIG. 9, the resultant structure of FIG. 6, that is, the plurality of semiconductor chips 107 of the first cassette ring 100 are aligned with the second cassette ring 110 so that bottom surfaces of the plurality of semiconductor chips 107 are aligned with the plurality of die attach film pieces of the die attach film 109 in a one-to-one correspondence manner. As a result, the first cassette ring 100 and the second cassette ring 110 are aligned with each other as shown in FIG. 9.

Figure 10:
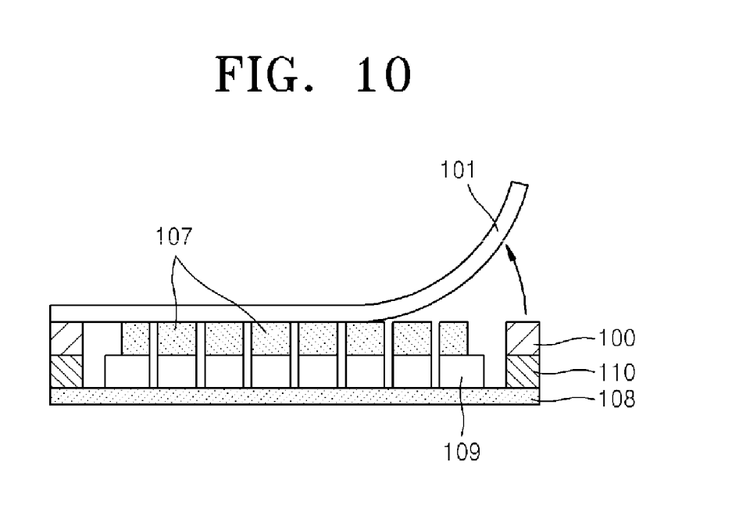
FIG. 10 is a cross-sectional view illustrating a case where after a plurality of semiconductor chips and the die attach film pieces are adhered to each other, a lamination tape is removed.

Referring to FIG. 10, the bottom surfaces of the plurality of semiconductor chips 107 are adhered to the plurality of die attach film pieces of the die attach film 109 at a pressure and a temperature at which there is an adhesive force between the semiconductor chips 107 and the die attach film pieces. The lamination tape 101 attached to an uppermost surface of the first cassette ring 100 is removed. Since active surfaces of the plurality of semiconductor chips 107 are protected by the lamination tape 101, the semiconductor chips 107 are not contaminated with particles that may occur during the two etching processes. The plurality of semiconductor chips 107 to which the die attach film 109 is attached are integrated into a plurality of semiconductor packages using die attaching, wire bonding, and molding.

A case where an extended tape is attached to a plurality of semiconductor chips will now be explained.

Figure 11:
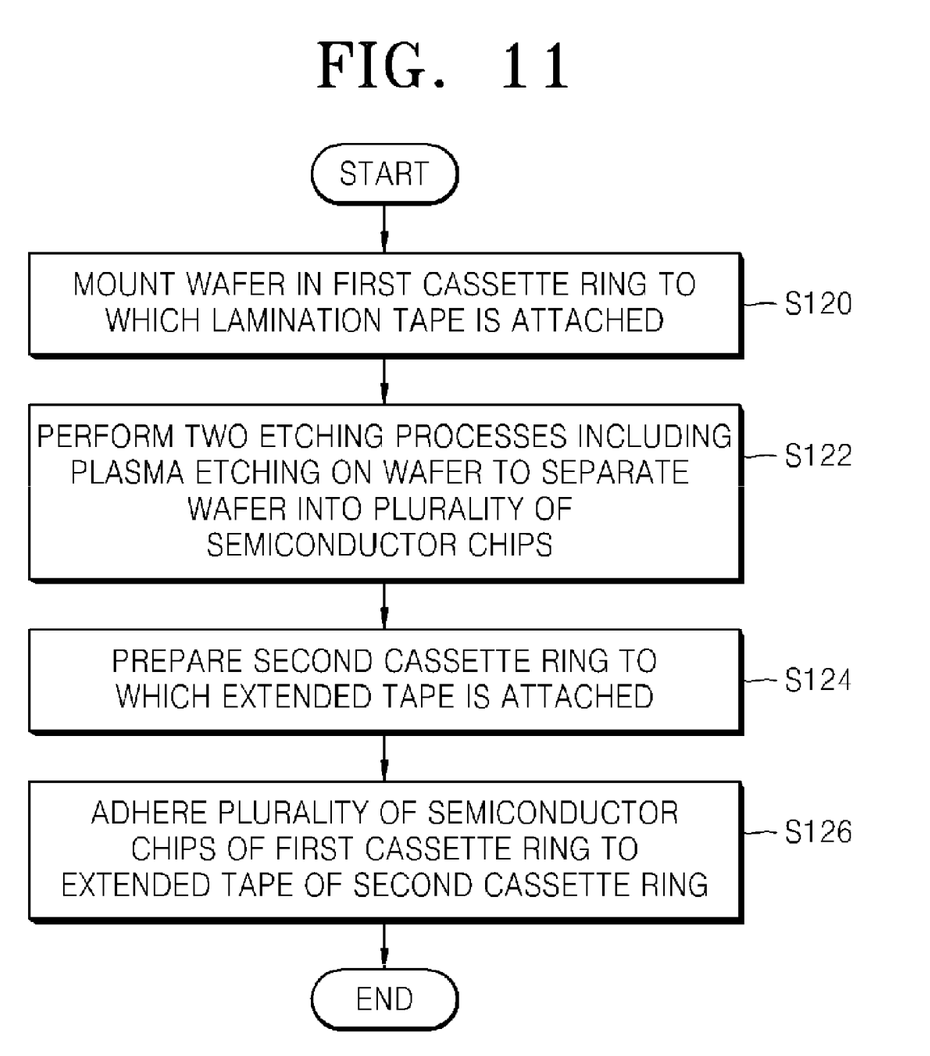
FIG. 11 is a flowchart illustrating a method of dicing a wafer using plasma, according to another embodiment of the present invention.

FIG. 11 is a flowchart illustrating a method of dicing a wafer using plasma, according to another application of the present invention.

Referring to FIG. 11, in operation S120, a wafer is disposed in a first cassette ring to which a lamination tape is attached as shown in FIG. 2. Wafer backside dicing information is obtained by using an image recognizing unit as shown in FIG.

2. In operation S122, two etching processes, wherein at least one includes plasma etching, are performed on the wafer to separate the wafer into a plurality of semiconductor chips as shown in FIGS. 4 through 6.

In operation S124, a second cassette ring to which an extended tape is attached is prepared. While the die attach film is attached to the extended tape in FIG. 7, no die attach film is attached to the extended tape in the method of FIG. 11. In operation S126, the plurality of semiconductor chips of the first cassette ring and the extended tape of the second cassette ring are adhered to each other. Optionally, the lamination tape attached to the first cassette ring may be removed.

The method of FIG. 11 will be explained again in detail with reference to FIGS. 12 through 14.

Figure 12:
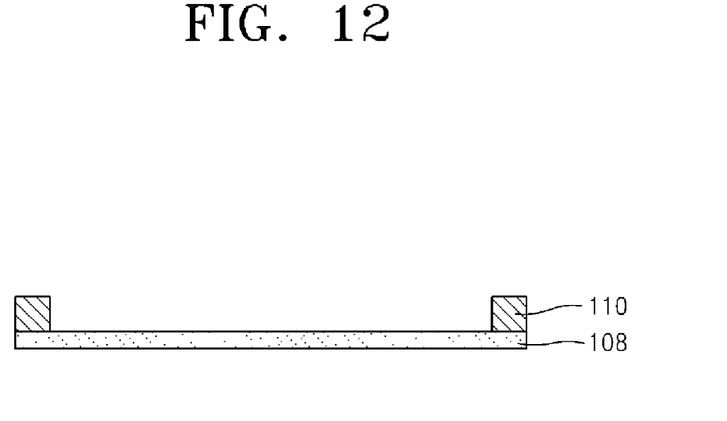
FIG. 12 is a cross-sectional view illustrating a case where an extended tape is attached to a second cassette ring.
Figure 13:
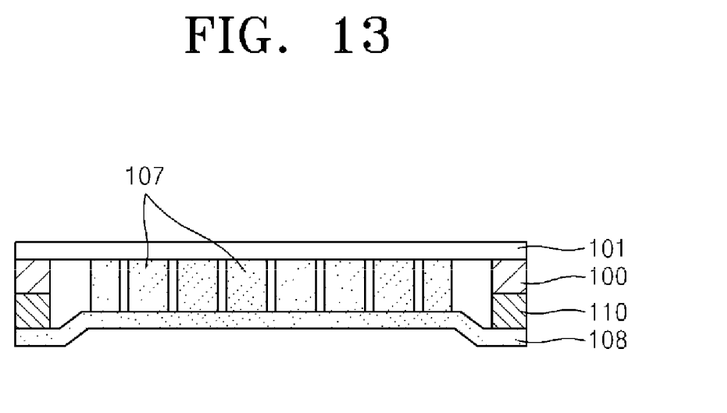
FIG. 13 is a cross-sectional view illustrating a case where a plurality of semiconductor chips of a first cassette ring are adhered to the extended tape of the second cassette ring.
Figure 14:
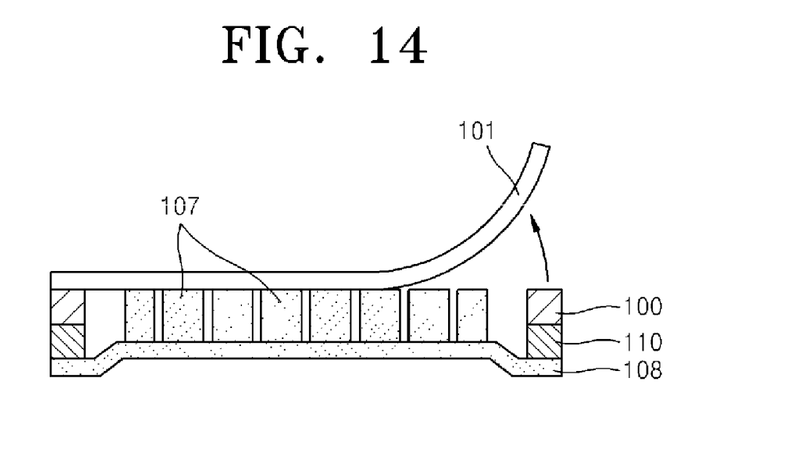
FIG. 14 is a cross-sectional view illustrating a case where after the plurality of semiconductor chips and the extended tape are adhered to each other, a lamination tape is removed.

Referring to FIGS. 12 through 14, after the resultant structure of FIG. 6 is obtained, the second cassette ring 110 to which the extended tape 108 is attached is prepared. The second cassette ring 110 and the first cassette ring 100 (see FIG. 2) may have the same size.

The resultant structure of FIG. 6, that is, the bottom surfaces of the plurality of semiconductor chips 107 of the first cassette ring 100 are attached to the extended tape 108 of the second cassette ring 110. The lamination tape 101 attached to the uppermost surface of the first cassette ring 100 is removed. Since the active surfaces of the plurality of semiconductor chips 107 are protected by the lamination tape, the active surfaces of the plurality of semiconductor chips 107 are not contaminated with particles that may occur during the two etching processes. The plurality of semiconductor chips 107 to which the extended tape 107 is attached are integrated into a plurality of semiconductor packages using die attaching, wire bonding, and molding.

As described above, the method according to the present invention has the following advantages: First, when a wafer that is thin and includes a low-K material is diced by the method, defects, such as chipping and cracking, can be reduced and high quality individual semiconductor chips can be obtained.

Second, since a wafer coating process necessary during general laser cutting is not necessary, the method can be performed at reduced costs.

Third, since an etch mask necessary during general plasma etching is not necessary, the method can be performed at reduced costs, processes can be simplified, and productivity can be improved.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A method of dicing a wafer using plasma, the method comprising:
    mounting the wafer in a first cassette ring to which a lamination tape is attached;
    separating the wafer into a plurality of semiconductor chips using two etching processes, wherein at least one of the two etching processes comprises plasma etching;
    preparing a second cassette ring to which a die attach film, to which an extended tape is attached, is attached, wherein the die attach film is cut into a plurality of die attach film pieces;
    aligning the first cassette ring with the second cassette ring; and
    adhering bottom surfaces of the plurality of semiconductor chips of the first cassette ring to the plurality of die attach film pieces of the die attach film of the second cassette ring.

2. The method of claim 1, wherein the mounting of the wafer in the first cassette ring comprises disposing the wafer in the first cassette ring in such a way that an active surface of the wafer is adhered to the lamination tape.

3. The method of claim 1, wherein the separating of the wafer into the plurality of semiconductor chips using the two etching processes comprises:
    recognizing scribe lines of an active surface of the wafer by using an image recognizing unit to obtain recognition information;
    converting the recognition information into position information corresponding to a backside of the wafer to obtain wafer backside dicing information;
    performing first etching on the backside of the wafer by using the wafer backside dicing information to form grooves having a depth that is half of the thickness of the wafer corresponding to the scribe lines; and
    performing second etching using plasma on the backside of the wafer having the grooves formed therein to separate the wafer into a plurality of semiconductor chips.

4. The method of claim 3, wherein the recognizing of the scribe lines of the active surface of the wafer by using the image recognizing unit comprises recognizing the scribe lines through the lamination tape, wherein the lamination tape is transparent and is attached to the first cassette ring.

5. The method of claim 3, wherein the recognizing of the scribe lines of the active surface of the wafer comprises recognizing the scribe lines on a front side of the wafer before the wafer is mounted in the first cassette ring.

6. The method of claim 3, wherein the performing of the first etching comprises performing the first etching using any one selected from the group consisting of mechanical sawing with a blade and laser cutting.

7. The method of claim 3, wherein the performing of the second etching comprises isotropically etching all of a backside of the wafer to separate the wafer into a plurality of semiconductor chips.

8. The method of claim 1, wherein each of the plurality of die attach film pieces of the die attach film attached to the second cassette ring has a size that is less than the size of each of the plurality of semiconductor chips.

9. The method of claim 1, after adhering the bottom surfaces of the plurality of semiconductor chips of the first cassette ring to the plurality of die attach film pieces of the die attach film of the second cassette ring, the method further comprising removing the lamination tape from the first cassette ring.

10. A method of dicing a wafer using plasma, the method comprising:
    mounting the wafer in a first cassette ring to which a lamination tape is attached;
    sawing the wafer into a plurality of semiconductor chips using two etching processes, wherein at least one of the two etching processes comprises plasma etching;
    preparing a second cassette ring to which an extended tape is attached; and
    adhering the plurality of semiconductor chips of the first cassette ring to the extended tape of the second cassette ring.

11. The method of claim 10, wherein the mounting of the wafer in the first cassette ring comprises mounting the wafer in the first cassette ring in such a way that an active surface of the wafer is adhered to the lamination tape.

12. The method of claim 10, wherein the sawing of the wafer into the plurality of semiconductor chips comprises:
- recognizing scribe lines of an active surface of the wafer by using an image recognizing unit to obtain recognition information;
- converting the recognition information into position information corresponding to a backside of the wafer to obtain wafer backside dicing information;
- performing first etching on the backside of the wafer by using the wafer backside dicing information along the scribe lines to form grooves having a depth that is half of the thickness of the wafer; and
- performing second etching using plasma on the backside of the wafer having the grooves formed therein to separate the wafer into a plurality of semiconductor chips.

13. The method of claim 12, wherein the performing of the first etching comprises performing the first etching using any one selected from the group consisting of mechanical sawing with a blade and laser cutting.

14. The method of claim 12, wherein the performing of the second etching using the plasma comprises isotropically etching all of a backside of the wafer to separate the wafer into a plurality of semiconductor chips.

15. The method of claim 10, after adhering the plurality of semiconductor chips of the first cassette ring to the extended tape of the second cassette ring, the method further comprising removing the lamination tape from the first cassette ring.

* * * * *